(12) United States Patent
Nakai

(10) Patent No.: US 8,008,733 B2
(45) Date of Patent: Aug. 30, 2011

(54) SEMICONDUCTOR DEVICE HAVING A POWER CUTOFF TRANSISTOR

(75) Inventor: Masakatsu Nakai, Kanagawa (JP)

(73) Assignee: Sony Corporation, Tokyo (JP)

( * ) Notice: Subject to any disclaimer, the term of this patent is extended or adjusted under 35 U.S.C. 154(b) by 153 days.

(21) Appl. No.: 12/453,503

(22) Filed: May 13, 2009

(65) Prior Publication Data

US 2009/0309170 A1  Dec. 17, 2009

(30) Foreign Application Priority Data

Jun. 11, 2008 (JP) ................................. 2008-153083

(51) Int. Cl.
*H01L 27/088* (2006.01)
(52) U.S. Cl. .... 257/393; 257/127; 257/371; 257/E27.06
(58) Field of Classification Search .................. 257/127, 257/371, 393
See application file for complete search history.

(56) References Cited

U.S. PATENT DOCUMENTS

| 5,250,833 | A * | 10/1993 | Watanabe ...................... 257/335 |
| 6,144,079 | A * | 11/2000 | Shirahata et al. ............. 257/392 |
| 7,759,740 | B1 * | 7/2010 | Masleid et al. ............... 257/371 |
| 2004/0164354 | A1 * | 8/2004 | Mergens et al. ............. 257/355 |
| 2006/0024929 | A1 * | 2/2006 | Kim .............................. 438/516 |
| 2006/0076575 | A1 * | 4/2006 | Masuoka ...................... 257/127 |
| 2006/0102961 | A1 * | 5/2006 | Ohkubo et al. .............. 257/371 |

FOREIGN PATENT DOCUMENTS

| JP | 05-003295 A | 1/1993 |
| JP | 08-186180 A | 7/1996 |
| JP | 09-107072 A | 4/1997 |
| JP | 10-032481 A | 2/1998 |
| JP | 10-303370 A | 11/1998 |
| JP | 2002-368124 A | 12/2002 |
| JP | 2006-114630 A | 4/2006 |
| WO | WO-2004/075295 A1 | 9/2004 |

OTHER PUBLICATIONS

Japanese Office Action issued Apr. 6, 2010 for corresponding Japanese Application No. 2008-153083.

* cited by examiner

*Primary Examiner* — A. Sefer

(74) *Attorney, Agent, or Firm* — Rader, Fishman & Grauer PLLC

(57) ABSTRACT

Disclosed herein is a semiconductor device having a power cutoff transistor including a semiconductor substrate of a first conductivity type; and first and second wells of the first conductivity type formed to be spaced from each other in the semiconductor substrate.

8 Claims, 5 Drawing Sheets

SEMICONDUCTOR DEVICE HAVING A POWER CUTOFF TRANSISTOR

BACKGROUND OF THE INVENTION

1. Field of the Invention

The present invention relates to a semiconductor device having a power cutoff transistor, adapted to control the supply and interruption of a source or reference voltage to a logic circuit, formed in the same semiconductor substrate as a logic transistor of the logic circuit.

2. Description of the Related Art

Recent years have seen an increase in transistor leak current in an OFF state as a result of smaller minimum dimensions required by the wafer process of the semiconductor device manufacturing (hereinafter simply referred to as the "process"). This has pushed up the percentage of useless power consumption caused by leak current in the overall power consumption of the semiconductor integrated circuit (chip). Today, this percentage has grown to a level which is no longer negligible.

Power gating is used as a way of reducing this useless power consumption. Power gating is also known as a circuit technique called MTCMOS (multi-threshold complementary metal oxide semiconductor).

Power gating is used by inserting a transistor having a high threshold voltage (power cutoff transistor) in series with a path adapted to supply a source current to a logic circuit. The power cutoff transistor is turned off during a period of time when the logic circuit can be inactivated. This cuts off the source current supply path, thus ensuring reduced leak current.

However, the above requires two different types of transistors, namely, a logic transistor of the logic circuit and a power cutoff transistor with a high threshold voltage, to be formed on the same semiconductor substrate, thus resulting in higher process cost.

To keep down the cost to the extent possible, the affinity (commonality) in process between the logic and power cutoff transistors has to be enhanced.

To achieve this, the same structures and manufacturing condition parameters have to be used for the different processes to the extent possible, that is, a higher percentage of the two types of transistors has to be manufactured in a single step. For example, the threshold voltage is changed only by controlling the channel concentration. Other parameters of the two transistors remain the same. Among the parameters which are identical between the two transistors are the type and concentration of impurities introduced into the source and drain regions, the material and thickness of the gate insulating film, and the material and thickness of the gate electrode.

SUMMARY OF THE INVENTION

However, the following disadvantages arise as a result of achieving a higher level of commonality between the two processes.

That is, the two transistors almost identical except for the channel concentration have almost the same voltage resistance. As a result, the two transistors have the same limitation in the upper limit of the gate control voltage.

Here, the threshold voltage of the logic transistor is set relatively small. Therefore, the gate control voltage is relatively small (e.g., 1.2 V or so).

Incidentally, the process is normally determined according to logic transistors so as to achieve the intended speed of the logic circuit. The logic transistors are predominantly large in number, and the circuit characteristics depend upon these transistors. Therefore, manufacturing power cutoff transistors, which are high in threshold voltage, in the same process as for the logic transistors, which are relatively low in gate control voltage (1.2V or so), leads to a large ON resistance. This gives rise to a higher series resistance in the path adapted to supply power to the logic circuit during operation, thus resulting in lower effective amplitude of the source voltage supplied to the logic circuit (difference between source and reference voltages). This leads to a lower speed of the logic circuit. Further, the power cutoff transistor size (so-called gate width) has to be increased to reduce the series resistance. In this case, however, the overall circuit area will increase, thus resulting in increased cost attributable to a cause unrelated to the process.

As described above, in order to use power gating, one comes to a deadlock in the development. That is, enhancing the commonality in process to keep down the cost leads to a lower speed of the logic circuit. Alternatively, increased cost arises as a result of increased circuit area which is a cause unrelated to the process.

It is an aim of the present invention to resolve a tradeoff between increased cost and performance degradation which poses difficulty to the use of power gating.

A semiconductor device according to embodiments of the present invention includes a semiconductor substrate of a first conductivity type, and first and second wells of the first conductivity type formed to be spaced from each other in the semiconductor substrate. A transistor of a logic circuit section is formed in the first well. A power cutoff transistor is formed in the second well. The same transistor is connected to a source current path adapted to drive the logic circuit section. The same transistor turns off in response to an input control signal, electrically cutting off the path. A shielding section is formed between the first and second wells to shield potential interference in the semiconductor substrate. Of two substrate regions shielded against potential interference by the shielding section, the one on the side of the second well has a substrate contact region formed therein. The substrate contact region is used to apply a substrate bias to the power cutoff transistor.

Here, the term "shielding" does not mean that there is absolutely no potential interference, but rather that potential interference is sufficiently suppressed to such an extent that the potential supplied during operation ensures proper operation.

In the embodiments of the present invention, the shielding section should preferably include two P-N junctions. The two P-N junctions are formed by introducing a well of a second conductivity type opposite to that of the semiconductor substrate. The opposite conductivity type well surrounds the first well except on the substrate front surface. The P-N junctions, opposite in orientation from each other, are formed one between the opposite conductivity type well and first well, and another between the opposite conductivity type well and semiconductor substrate.

In the embodiments of the present invention, the substrate contact region should preferably be of the first conductivity type. The substrate contact region and second well, both of which are of the first conductivity type, should preferably be connected together by a semiconductor substrate region which is of the same first conductivity type.

In the embodiments of the present invention, the substrate contact region should preferably be provided around a circuit forming region when a transistor forming region of the semiconductor substrate is seen in plan view. The circuit forming region should preferably include a forming region of the logic circuit and a forming region of the power cutoff transistor in contact with the logic circuit forming region.

In the embodiments of the present invention, a logic transistor should preferably be formed in the first well. The logic transistor and power cutoff transistor should preferably be structured so that their threshold voltages are the same.

Source and drain regions of the logic transistor and power cutoff transistor should preferably be formed with a second conductivity type semiconductor region containing the same type of impurity at the same concentration. A first conductivity type well region, provided between the source and drain regions, should preferably contain the same type of impurity at the same concentration. A gate insulating film, formed on the well region, should preferably be made of the same material and have the same thickness. A gate electrode provided on the gate insulating film should preferably be made of the same material. Further, the gate electrode is equally sized in the direction in which the source and drain regions are spaced from each other.

In the embodiments of the present invention, the substrate contact region should preferably be formed on the rear surface of the semiconductor substrate on the opposite side of the front surface thereof on which the transistors are formed.

Alternatively, the substrate contact region should preferably be formed on the side surface of the semiconductor substrate which is in contact with both the front surface on which the transistors are formed and the rear surface.

DETAILED DESCRIPTION OF THE PREFERRED EMBODIMENTS

Embodiments of the present invention resolve a tradeoff between increased cost and performance degradation which poses difficulty to the use of power gating.

The preferred embodiments of the present invention will be described below with reference to the accompanying drawings.

First Embodiment

Figure 1:
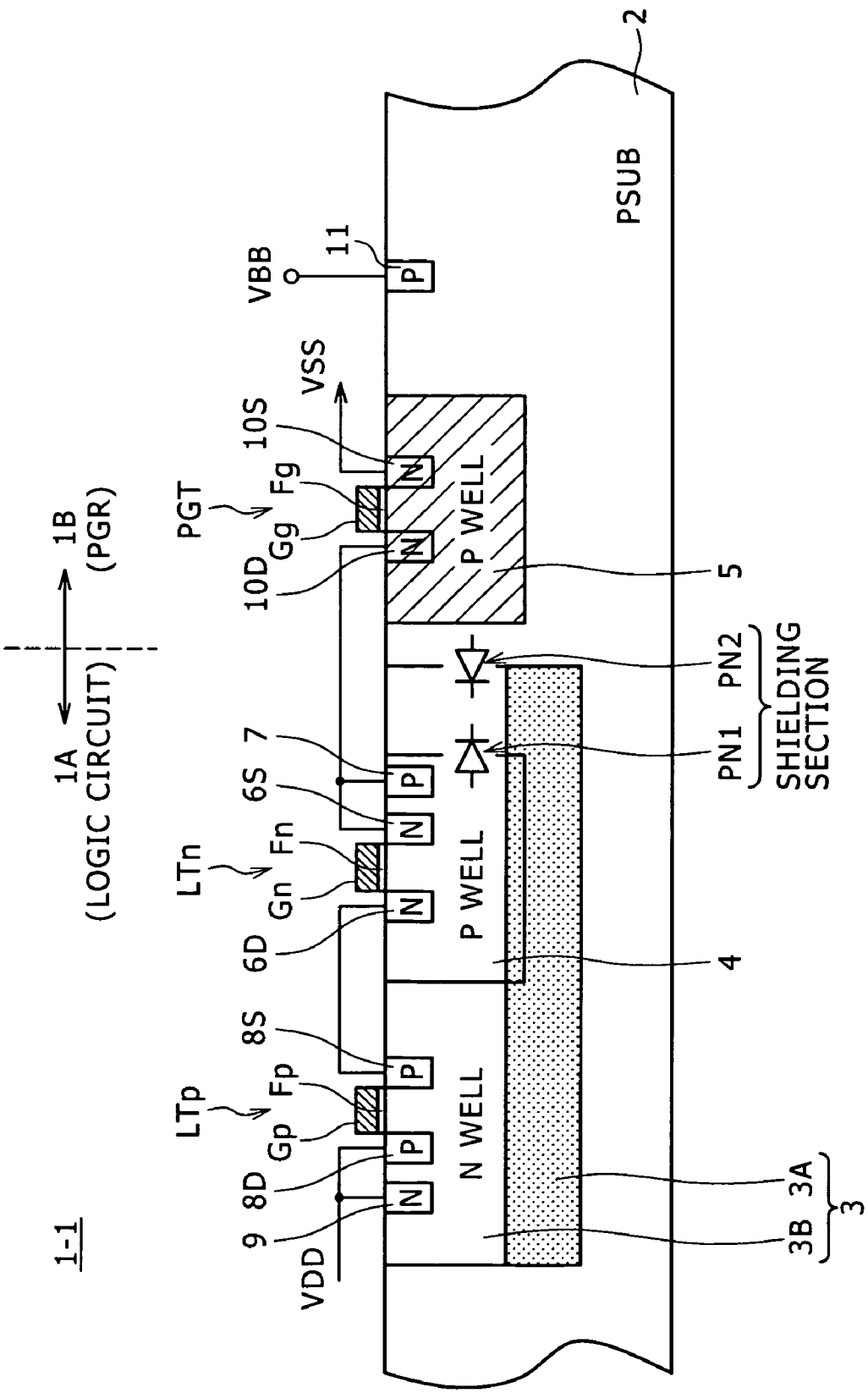
FIG. 1 is a sectional structural view of a semiconductor integrated circuit according to a first embodiment.
Figure 2:
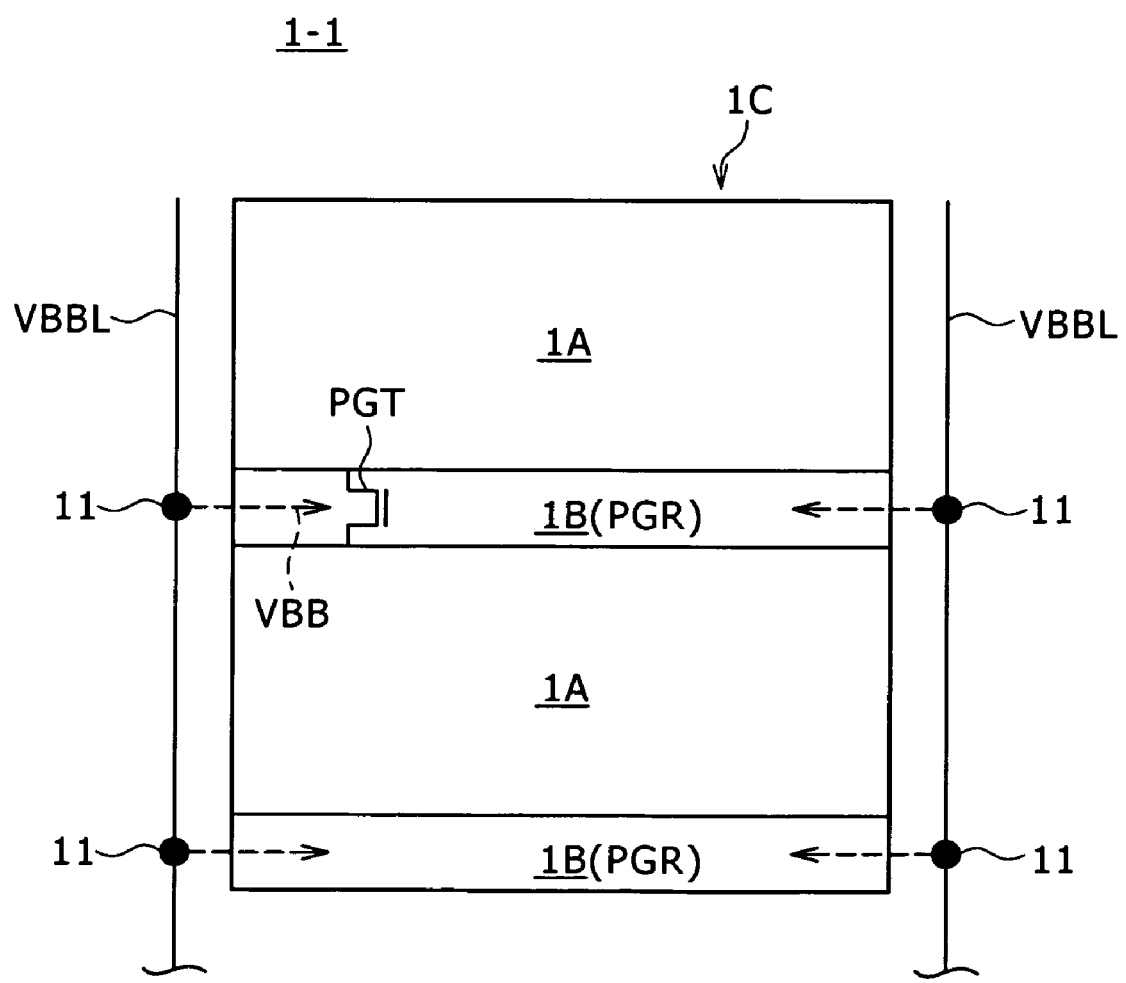
FIG. 2 is a partial plan layout view of the semiconductor integrated circuit according to the first embodiment.

FIG. 1 illustrates a sectional structural view of a semiconductor integrated circuit according to a first embodiment. FIG. 2 illustrates a partial plan layout of the semiconductor integrated circuit according to the first embodiment. The term "semiconductor integrated circuit" refers to the chip section of the semiconductor device. Therefore, the semiconductor device is supplied either in the form of a bare chip or package.

One of the characteristics of the first embodiment is that a deep N well is provided in the logic circuit section of the semiconductor device having a transistor adapted to cut off the power supply path (hereinafter referred to as the power cutoff transistor).

A semiconductor integrated circuit 1-1 illustrated in FIG. 1 has, for example, a P-type silicon wafer as a P-type semiconductor substrate. This P-type semiconductor substrate will be hereinafter referred to as a P-type substrate (PSUB) 2.

One of the main surfaces of the P-type substrate 2 is called the transistor forming surface (or substrate front surface). The other main surface is called the rear surface.

When viewed from the substrate front surface, a circuit forming region 1C adapted to achieve a given function includes, for example, as illustrated in FIG. 2, a logic circuit forming region 1A and power gate region (PGR) 1B. The power gate region 1B is provided in contact with the logic circuit forming region 1A. The power gate region 1B includes a power cutoff transistor PGT adapted to cut off the power supply path to the logic circuit.

It should be noted that the layout relationship between the logic circuit forming region 1A and power gate region 1B in FIG. 2 is not limited to that illustrated in this figure. Alternatively, the power gate region 1B may be laid out to be vertically long. Still alternatively, the plurality of irregularly isolated power gate regions 1B may be laid out.

FIG. 1 illustrates the section of the logic circuit forming region 1A and power gate region 1B.

As illustrated in FIG. 1, an N-type well (N well) 3 is formed on the substrate front surface of the P-type substrate 2. The N well 3 includes an N well section (hereinafter deep N well) 3A and shallow N well 3B. The deep N well 3A is formed in a deep position from the substrate front surface. The shallow N well 3B is formed on the deep N well 3A to the substrate front surface.

In general, a deep N well is often provided in an analog circuit forming region (not shown) to provide reduced noise propagation from the P-type substrate.

In the present embodiment, the deep N well 3A is provided in the logic circuit forming region 1A. The N well 3 made up of the shallow N well 3B and deep N well 3A corresponds to an example of opposite conductivity type well.

A P-type well (hereinafter first P well) 4 is formed in the N well 3. The first P well 4 is surrounded by the opposite conductivity type well, i.e., N well 3, except on the substrate front surface.

Unlike the logic circuit forming region 1A having the well structure described above, no opposite conductivity well is formed in the power gate region 1B. Therefore, a P-type well (hereinafter second P well) 5 is formed directly on the substrate front surface of the P-type substrate 2.

The second P well 5 may be formed separately from the first P well 4. However, these two wells should preferably be formed simultaneously for reduced process cost. In the simultaneous formation, the type of P-type impurity in the well and the concentration profile along the depth are almost the same for the two wells (first and second P wells 4 and 5).

The region between the first and second P wells 4 and 5 formed as described above is shielded against potential interference by the "shielding section." In the present embodiment, the term "shielding" does not mean that there is absolutely no potential interference, but rather that potential interference is sufficiently suppressed to such an extent that the potential supplied during operation ensures proper operation.

More specifically, the "shielding section" is introduced by forming the N well 3. As indicated by diode symbols in FIG. 1 for easy understanding, two P-N junctions are formed, namely, a P-N junction between the first P well 4 and N well 3 (PN1) and another between the N well 3 and P-type substrate 2 (PN2). These two P-N junctions are effective in shielding potential interference because the two junctions form diodes which are opposite in orientation. That is, the "shielding section" in the present embodiment includes such two P-N junctions.

An N-type logic transistor LTn is formed in the first P well 4. A P-type logic transistor LTp is formed in the shallow N well 3B.

The N-type logic transistor LTn includes an N-type source region 6S, N-type drain region 6D, gate insulating film Fn and gate electrode Gn. The N-type source region 6S and N-type drain region 6D are spaced from each other. The gate insulating film Fn and gate electrode Gn are formed on a P well region between the source region 6S and drain region 6D.

Although opposite in conductivity type, the P-type logic transistor LTp also includes a source region 8S, drain region 8D, gate insulating film Fp and gate electrode Gp.

On the other hand, the N-type power cutoff transistor PGT is formed in the second P well 5.

The power cutoff transistor PGT includes an N-type source region 10S, N-type drain region 10D, gate insulating film Fg and gate electrode Gg. The N-type source region 10S and N-type drain region 10D are spaced from each other. The gate insulating film Fg and gate electrode Gg are formed on a P well region between the source region 10S and drain region 10D.

Here, the N-type logic transistor LTn and power cutoff transistor PGT are almost identical in structure and process parameters because the two are formed simultaneously.

Therefore, the N-type logic transistor LTn and power cutoff transistor PGT are identical in source and drain impurity types and concentrations, channel impurity type and concentration, gate insulating film material and thickness and gate electrode material and thickness. Naturally, although the two transistors are said to be identical in the above characteristics, there is some variation. In the embodiments of the present invention, however, the term "identical" assumes that there is a certain extent of variation and means that no intentional difference is provided.

As illustrated in FIG. 1, for example, the transistors are connected together by an unshown overlying wiring. In the example shown in FIG. 1, the P-type logic transistor LTp, N-type logic transistor LTn and power cutoff transistor PGT are connected together in series in this order between the supply lines of the source voltage VDD and reference voltage VSS (e.g., ground voltage GND). The two logic transistors have, for example, their gates connected together, thus forming an inverter. The power cutoff transistor PGT is connected between the source of the N-type logic transistor LTn and the reference voltage VSS. Thus, the same transistor PGT is inserted in the source current supply path to the gate circuit making up the logic circuit, thus controlling the supply of power to the logic circuit. A gate signal is supplied from an unshown control circuit to the power cutoff transistor PGT.

One of the characteristics of the present embodiment is that a substrate contact region 11 is provided on the side of the second P well 5. The second P well 5 is one of the two substrate regions divided by the shielding section (two P-N junctions), i.e., the first P well 4 and other substrate region. The substrate contact region 11 is a P-type impurity region externally supplied with a substrate bias voltage VBB.

The substrate bias voltage VBB acts on the channel region of the power cutoff transistor PGT formed in the second P well 5 as a back bias. The reason for this is that the shielding section has no effect on the substrate bias voltage VBB because the supply path of the same voltage VBB is formed entirely with a P-type semiconductor although there is some resistance. On the other hand, the substrate bias voltage VBB does not serve as a back bias for the N-type logic transistor LTn because this voltage is blocked by the shielding section.

The threshold voltage of the power cutoff transistor PGT can be changed according to the magnitude of the substrate bias voltage VBB. Normally, as the substrate bias voltage VBB is lowered below the reference voltage VSS, the threshold voltage of the power cutoff transistor PGT increases. Therefore, when the logic circuit is inactive, the effective threshold voltage is increased with, for example, the gate voltage applied to the same transistor PGT maintained constant. This provides reduced leak current. Further, because the threshold voltage increases, the ON resistance of the same transistor PGT drops even for the same gate voltage as for the logic transistor. This provides larger effective amplitude of the source voltage supplied to the logic circuit in proportion to the smaller ON resistance, thus contributing to increased operating speed of the logic circuit.

On the other hand, the power cutoff transistor PGT will not increase in size due to increased operating speed. Rather, a sufficiently high operating speed allows leeway to reduce the size. This saves materials for the substrate and components and ensures higher yield and reduced cost.

As illustrated in FIG. 2, the substrate contact region 11 should preferably be provided outside the circuit forming region 1C. This provides a significantly smaller area for the power gate region 1B than when the substrate contact region is provided in the same region 1B, in which case the supply line of the substrate bias voltage VBB passes through the same region 1B. Therefore, the cost can be significantly reduced also in this respect.

A second and succeeding embodiments which will be described below correspond to modifications of the first embodiment. Accordingly, like components as those described above are denoted by like reference numerals, and their description will be omitted or simplified.

Second Embodiment

Figure 3:
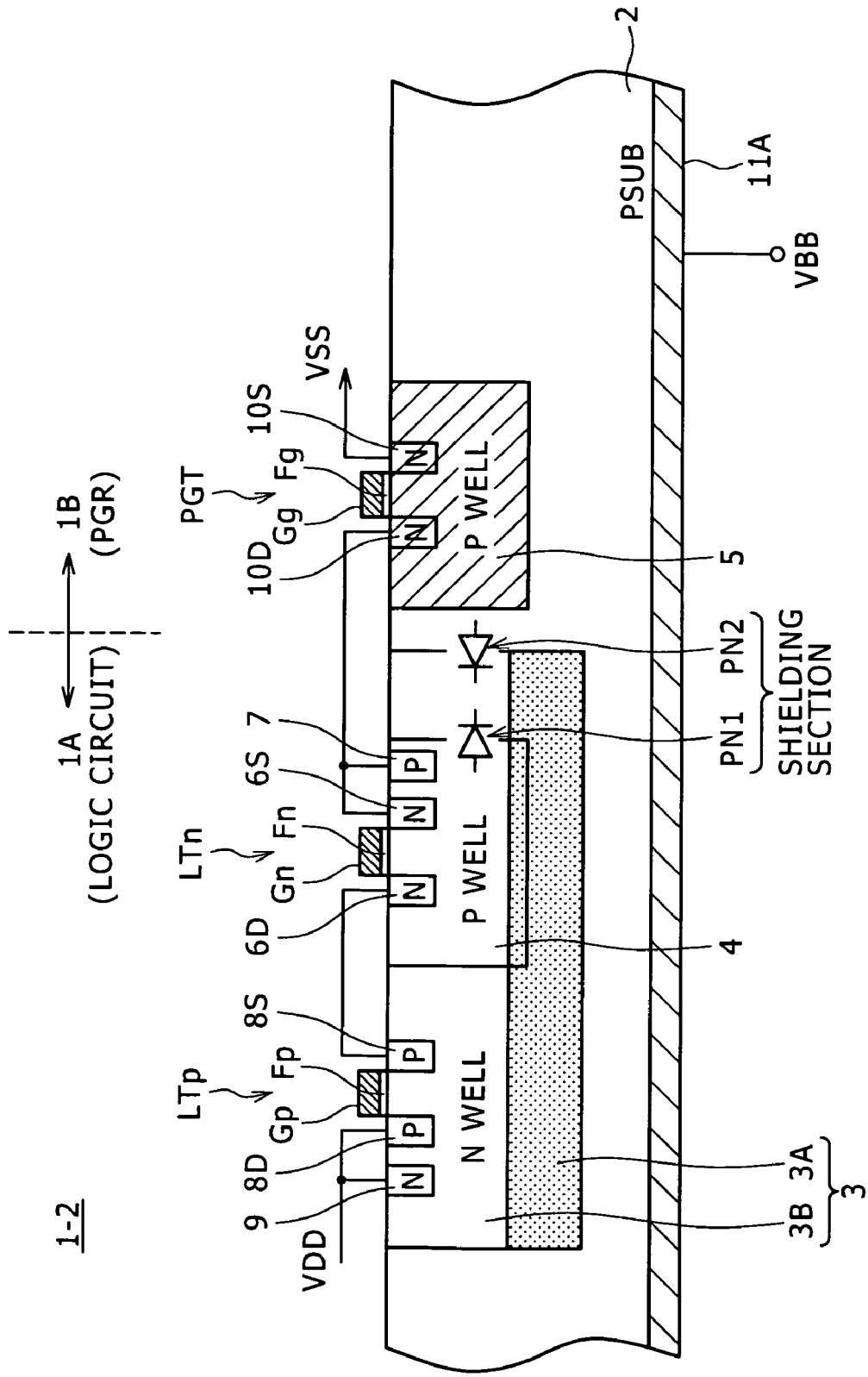
FIG. 3 is a sectional structural view of a semiconductor integrated circuit according to a second embodiment.

FIG. 3 illustrates a sectional structural view of a semiconductor integrated circuit according to a second embodiment.

In the present embodiment, a substrate contact region 11A is provided on the substrate rear surface. An arbitrary number (one or more) of terminals may be connected to this region.

During the assembly of the chip (semiconductor integrated circuit 1-2), the chip may be die-bonded to the die pad via a conductive paste. In this case, the die pad is connected to the external terminal for the substrate bias voltage VBB (package terminal) rather than to that for the ground voltage GND. The normal reference voltage VSS is connected only from the chip surface through wire bonding.

Further, in the case of a three-dimensional IC, a second chip may be electrically or mechanically joined on top of a first one. In this case, the rear surface of the second chip is joined to the pattern, adapted to apply the substrate bias voltage VBB, which is formed on the front surface of the first chip. This permits ready supply of the substrate bias to the second chip without any complicated path such as via holes.

Further, the area on the front surface can be saved, providing a substantially smaller chip size. This permits saving of substrate and other material cost and contributes to improved yield in proportion to the smaller chip size, thus contributing to reduced cost.

Third Embodiment

Figure 4:
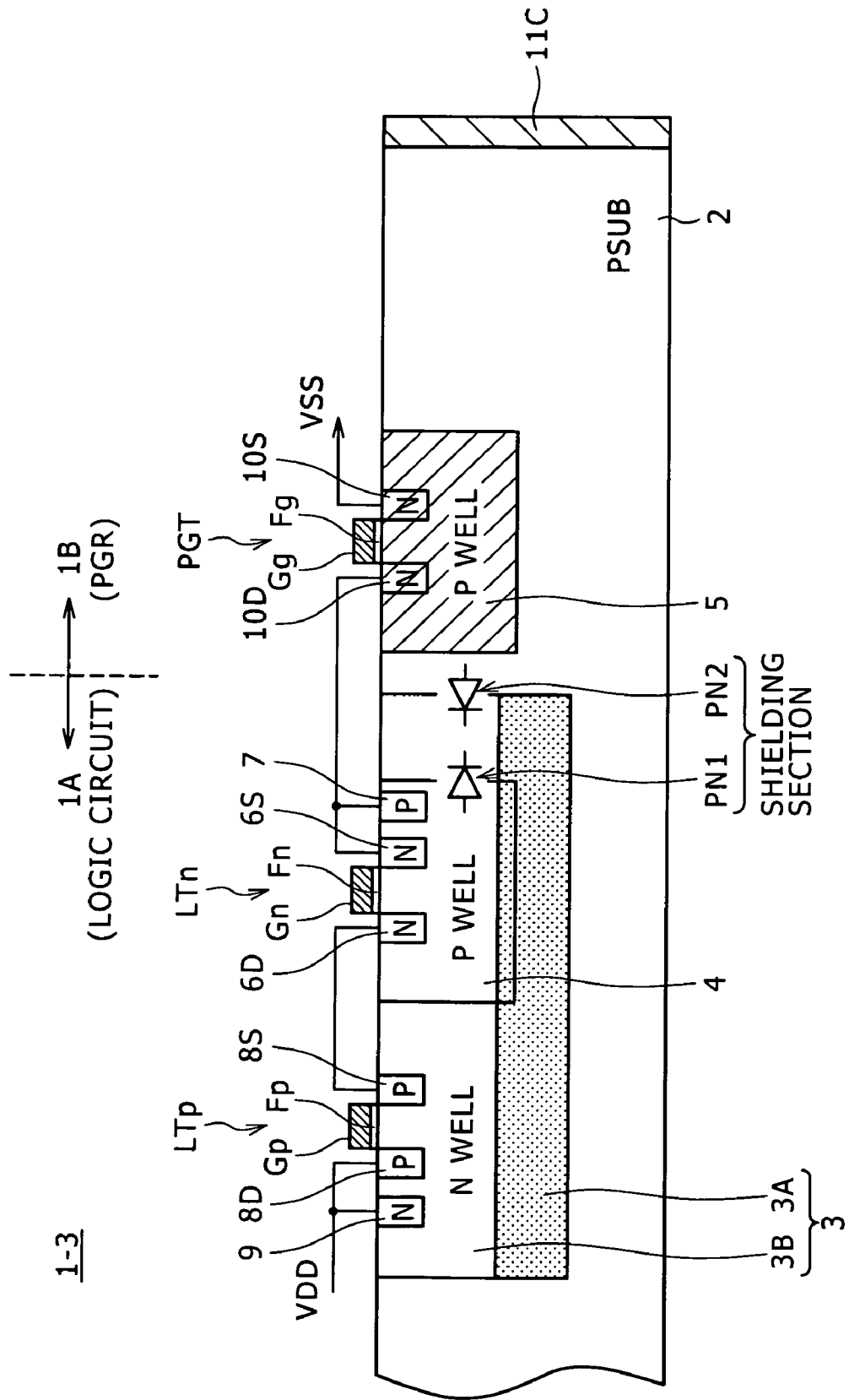
FIG. 4 is a sectional structural view of a semiconductor integrated circuit according to a third embodiment.

FIG. 4 illustrates a sectional structural view of a semiconductor integrated circuit according to a third embodiment.

In the present embodiment, a substrate contact region 11C is provided on the substrate side surface. An arbitrary number (one or more) of terminals may be connected to this region.

Prior to the dicing of a wafer into a chip (semiconductor integrated circuit 1-3), part of the scribe line is etched from the rear so that the side surface is exposed. Then, a P-type region (substrate contact region 11C) and electrode are formed on the side surface. Cutting the wafer along the scribe line forms the semiconductor integrated circuit 1-3 having the substrate contact region 11C on its side surface.

As with the second embodiment, the present embodiment also permits saving of the area on the front surface, providing a substantially smaller chip size. This permits saving of substrate and other material cost and contributes to improved yield in proportion to the smaller chip size, thus contributing to reduced cost. Further, the chip side surface can be put to an effective use in a three-dimensional IC, thus saving wiring resources for the substrate bias voltage VBB. Assuming that the semiconductor integrated circuit 1-3 is an intermediate chip in the three-dimensional IC, the same circuit 1-3 can be readily connected to the upper chip having a rear surface connection structure (FIG. 3) and the lower chip having a front surface connection structure (FIG. 1) via the side surface.

Fourth Embodiment

Figure 5:
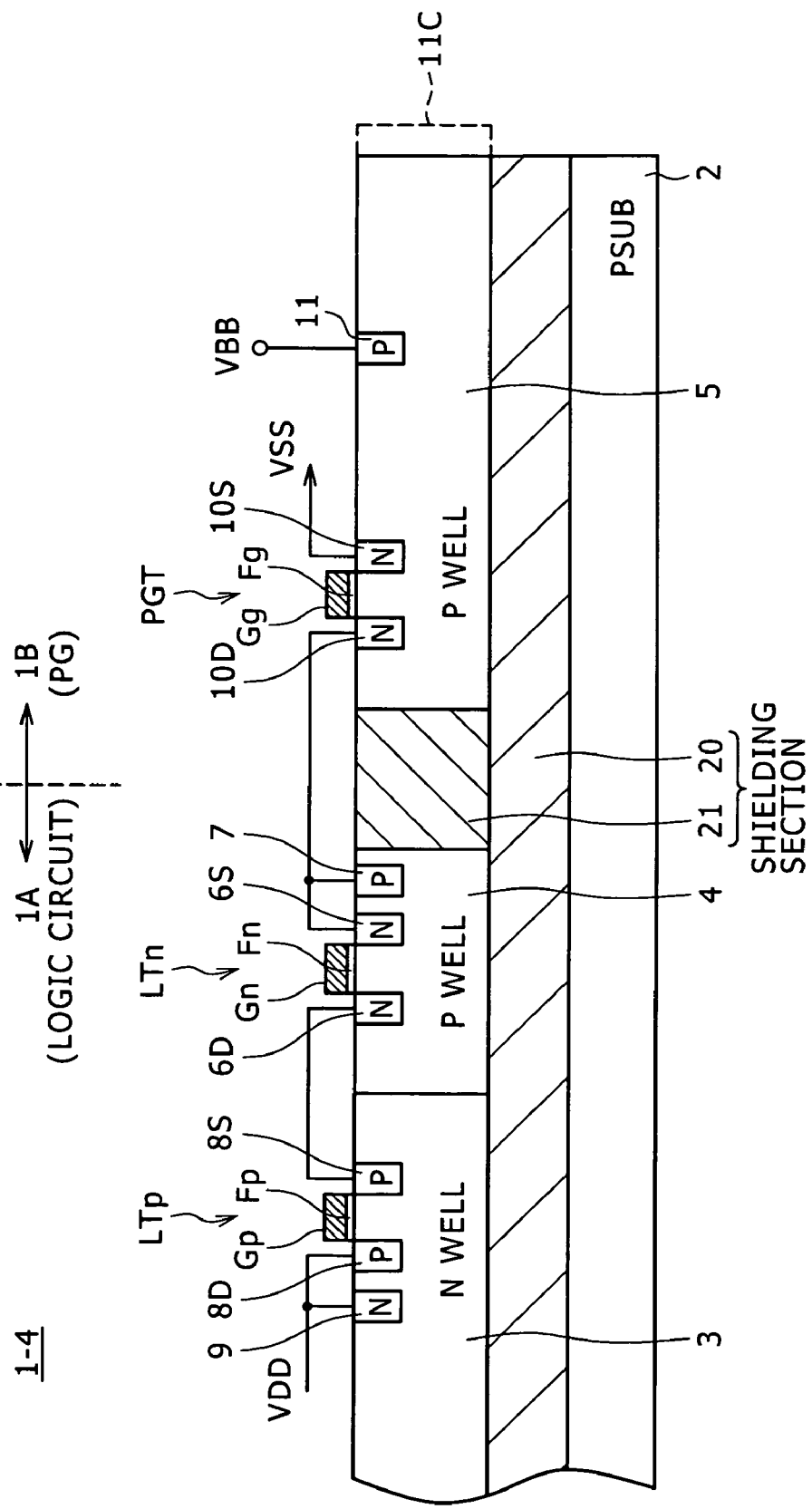
FIG. 5 is a sectional structural view of a semiconductor integrated circuit according to a fourth embodiment.

FIG. 5 illustrates a sectional structural view of a semiconductor integrated circuit according to a fourth embodiment.

In the present embodiment, the substrate contact region 11C is provided on the substrate side surface. An arbitrary number (one or more) of terminals may be connected to this region.

It should be noted, however, that a semiconductor integrated circuit 1-4 has a so-called SOI structure. The same circuit 1-4 includes a semiconductor layer (SOI layer) provided on top of a substrate isolation insulating layer 20 formed on the P-type substrate 2. An element isolation insulating layer 21 is formed with an insulating material in the SOI layer. The same layer 21 is formed in such a manner as to cut through the SOI layer along its thickness. This separates the SOI layer into the logic circuit forming region 1A and power gate region 1B.

In this case, the substrate contact region 11 may be formed in the SOI layer outside the second P well 5 as with the other embodiments. However, the same region 11 may also be formed inside the second P well 5, as illustrated in FIG. 5.

Alternatively, the substrate contact region 11C may be formed on the side surface where the second P well 5 is exposed.

It should be noted that a modification of any of the first to fourth embodiments is possible in which all the conductivity types and impurity conductivity types are reversed and in which the power cutoff transistor PGT is connected between the source voltage VDD and the source of the P-type logic transistor LTp.

As described above, the first to fourth embodiments suppress degradation in operating speed while at the same time allowing avoidance of an increase in cost resulting from additional process steps in the implementation of power gating.

In ordinary power gating, two types of transistors having different threshold voltages are manufactured. In contrast, the embodiments of the present invention employ only one type of transistors. The transistor threshold voltage generally changes due, for example, to process variations. However, the threshold voltage can be changed by adjusting the substrate potential (substrate bias voltage) so that this potential acts on the transistor channel. In an N-channel transistor, the threshold voltage can be increased by changing the potential of the P well directly under the transistor to a negative level. Using this characteristic, the threshold voltage of the transistor inserted to cut off the power supply path is increased, thus providing reduced leak current in an OFF state.

The first and fourth embodiments in particular supply a back gate bias through the P-type substrate 2. This provides a reduced metal wiring area in the power cutoff transistor PGT forming region.

The second embodiment supplies a back gate bias from the substrate rear surface. This provides a reduced area of terminals directly connected to the P well.

The third embodiment supplies a back gate bias from the substrate side surface. This provides a reduced area of terminals directly connected to the P well. Further, this embodiment offers an effective means of solving the limitations of connectivity to the front and rear surfaces in three-dimensional packaging.

The present application contains subject matter related to that disclosed in Japanese Priority Patent Application JP 2008-153083 filed in the Japan Patent Office on Jun. 11, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor device having a power cutoff transistor comprising:
   a semiconductor substrate of a first conductivity type; and
   first and second wells of the first conductivity type formed to be spaced from each other in the semiconductor substrate, wherein
   a transistor of a logic circuit section is formed in the first well,
   a power cutoff transistor is formed in the second well, the power cutoff transistor being connected to a source current path adapted to drive the logic circuit section and turning off in response to an input control signal so as to electrically cut off the path, a shielding section is formed between the first and second wells to shield potential interference in the semiconductor substrate, and
   of two substrate regions shielded against potential interference by the shielding section, the one on the side of the second well has a substrate contact region formed therein, the substrate contact region being used to apply a substrate bias to the power cutoff transistor.

2. The semiconductor device having a power the power cutoff transistor of claim 1, wherein
   the shielding section includes
   two P-N junctions formed by introducing a well of a second conductivity type opposite to that of the semiconductor substrate, the opposite conductivity type well surrounding the first well except on a substrate front surface, the P-N junctions, opposite in orientation from each other, being formed one between the opposite conductivity type well and first well, and another between the opposite conductivity type well and the semiconductor substrate.

3. The semiconductor device having the power cutoff transistor of claim 1, wherein
   the substrate contact region is of the first conductivity type, and the substrate contact region and the second well, both of which are of the first conductivity type, are connected together by a semiconductor substrate region which is of the same first conductivity type.

4. The semiconductor device having the power cutoff transistor of claim 1, wherein
the substrate contact region is provided around a circuit forming region when a transistor forming region of the semiconductor substrate is seen in plan view, the circuit forming region including
a forming region of the logic circuit, and
a forming region of the power cutoff transistor in contact with the logic circuit forming region.

5. The semiconductor device having the power cutoff transistor of claim 1, wherein
a logic transistor is formed in the first well, and
the logic transistor and power cutoff transistor are structured so that their threshold voltages are the same.

6. The semiconductor device having the power cutoff transistor of claim 5,
wherein source and drain regions of the logic transistor and power cutoff transistor are formed with a second conductivity type semiconductor region containing a first type of impurity at a first concentration, and
the semiconductor device having the power cutoff transistor further comprising a first conductivity type well region, provided between the source and drain regions of the logic transistor and power cutoff transistor;
a gate insulating film for the logic transistor;
a gate insulating film for the power cutoff transistor that is made of the same material and has the same thickness as the gate insulating film for the logic transistor;
a gate electrode provided on the gate insulating film for the logic transistor;
a gate insulating film for the power cutoff transistor that is made of the same material as the gate electrode provided on the gate insulating film for the logic transistor; and
the gate electrodes are equally sized in the direction in which the source and drain regions are spaced from each other.

7. The semiconductor device having the power cutoff transistor of claim 1, wherein
the substrate contact region is formed on the rear surface of the semiconductor substrate on the opposite side of the front surface on which the logic transistor and the power cutoff transistor are formed.

8. The semiconductor device having the power cutoff transistor of claim 1, wherein
the substrate contact region is formed on the side surface of the semiconductor substrate which is in contact with both the front surface on which the transistor of a logic circuit section and the power cutoff transistor are formed and the rear surface.

* * * * *